United States Patent
Ellä et al.

(10) Patent No.: US 9,866,266 B2
(45) Date of Patent: Jan. 9, 2018

(54) FRONT-END CIRCUIT HAVING A TUNABLE FILTER

(71) Applicant: Snaptrack Inc., San Diego, CA (US)

(72) Inventors: Juha Ellä, Halikko (FI); Edgar Schmidhammer, Stein an der Traun (DE)

(73) Assignee: SnapTrack, Inc., San Diego, CA (US)

( * ) Notice: Subject to any disclaimer, the term of this patent is extended or adjusted under 35 U.S.C. 154(b) by 0 days.

(21) Appl. No.: 15/120,082

(22) PCT Filed: Jun. 6, 2014

(86) PCT No.: PCT/EP2014/061870
§ 371 (c)(1),
(2) Date: Aug. 18, 2016

(87) PCT Pub. No.: WO2015/128007
PCT Pub. Date: Sep. 3, 2015

(65) Prior Publication Data
US 2017/0077983 A1    Mar. 16, 2017

(30) Foreign Application Priority Data

Feb. 28, 2014  (DE) ........................ 10 2014 102 701

(51) Int. Cl.
*H04B 1/40*  (2015.01)
*H04B 1/48*  (2006.01)
(Continued)

(52) U.S. Cl.
CPC ............. *H04B 1/48* (2013.01); *H03H 7/1708* (2013.01); *H03H 7/1775* (2013.01);
(Continued)

(58) Field of Classification Search
CPC ...... H04B 1/48; H04B 1/0064; H03H 7/1708; H03H 7/1775; H03H 7/465; H03H 2210/025
(Continued)

(56) References Cited

U.S. PATENT DOCUMENTS 8,879,436 B2    11/2014  Ishida
2004/0127178 A1  7/2004  Kuffner
(Continued)

FOREIGN PATENT DOCUMENTS

DE    60100421 T2    4/2004
DE    60207546 T2    7/2006
(Continued)

OTHER PUBLICATIONS

Brank. J. et al., "RF MEMS-Based Tunable Filters," International Journal of RF and Microwave Computer-Aided Engineering, Aug. 10, 2001, pp. 276-284.
(Continued)

*Primary Examiner* — Nay A Maung
*Assistant Examiner* — Angelica M Perez
(74) *Attorney, Agent, or Firm* — Patterson & Sheridan, L.L.P.

(57) ABSTRACT

A front-end circuit with a tunable filter is disclosed. In an embodiment, the front end circuit includes a first signal path connected to an antenna connection, a first filter arranged in the first signal path, wherein the first filter is tunable within a first frequency range, and an extra signal path and a first fixed filter arranged therein, wherein the first fixed filter has a passband for an extra frequency band, wherein the first fixed filter is not tunable, and wherein the extra frequency band is arranged outside or inside the first frequency range. The front end circuit further includes a narrowband antenna tuner configured to be set to a respective tunable frequency (Continued)

range, wherein the narrowband antenna tuner is arranged between the first filter, the first fixed filter and the antenna connection in the first and second signal paths.

18 Claims, 5 Drawing Sheets

(51) Int. Cl.
*H04B 1/00* (2006.01)
*H03H 7/01* (2006.01)
*H03H 7/46* (2006.01)

(52) U.S. Cl.
CPC ........... *H03H 7/465* (2013.01); *H04B 1/0064* (2013.01); *H03H 2210/025* (2013.01)

(58) Field of Classification Search
USPC .......................................................... 455/77
See application file for complete search history.

(56) References Cited

U.S. PATENT DOCUMENTS

| | | | |
|---|---|---|---|
| 2005/0088255 A1* | 4/2005 | Sengupta | H01P 1/20 333/174 |
| 2009/0286501 A1 | 11/2009 | Rousu et al. | |
| 2012/0169565 A1 | 7/2012 | Morris, III | |
| 2013/0147574 A1 | 6/2013 | Wada | |
| 2014/0055210 A1* | 2/2014 | Black | H04B 1/525 333/132 |

FOREIGN PATENT DOCUMENTS

| | | |
|---|---|---|
| EP | 0910132 A2 | 4/1999 |
| EP | 2609686 A2 | 7/2013 |
| WO | 2009134788 A1 | 11/2009 |
| WO | 2011004525 A1 | 1/2011 |
| WO | 2012020613 A1 | 2/2012 |
| WO | 2012027703 A2 | 3/2012 |

OTHER PUBLICATIONS

Inoue, H. et al., "A Novel Tunable Filter Enabling both Center Frequency and Bandwidth Tunability," Proceedings of the 42nd European Microwave Conference, Oct. 29-Nov. 1, 2012, pp. 269-272.
Kadota, M. et al., "Tunable Filters Using Wideband Elastic Resonators," IEEE Transactions on Ultrasonics, Ferroelectrics, and Frequency Control, vol. 60, No. 10, Oct. 2013, pp. 2129-2136.
Levy, R., "Filters with Single Transmission Zeros at Real or Imaginary Frequencies," IEEE Transactions on Microwave Theory and Techniques, vol. MTT-24, No. 4, Apr. 1976, pp. 172-181.
Lu, X. et al., "Reconfigurable Multiband SAW filters for LTE Applications," 2013 IEEE 13th Topical Meeting on Silicon Monolithic Integrated Circuits in RF Systems (SiRF), Jan. 21-23, 2013, pp. 153-155.
Wada, T. et al., "Tunable Isolator using Variable Capcitor for Multi-Band System," 2013 IEEE MTT-S International Microwave Symposium Digest (IMS), Jun. 2-7, 2013, 3 pages.
International Search Report and Written Opinion—PCT/EP2014/061870—ISA/EPO—dated Dec. 9, 2014.

* cited by examiner

FRONT-END CIRCUIT HAVING A TUNABLE FILTER

This patent application is a national phase filing under section 371 of PCT/EP2014/061870, filed Jun. 6, 2014, which claims the priority of German patent application 10 2014 102 701.9, filed Feb. 28, 2014, each of which is incorporated herein by reference in its entirety.

TECHNICAL FIELD

The invention relates to a front-end circuit having a tunable filter, as can be used in non-wired communication devices, for example. It also relates to a front-end circuit which enables a carrier aggregation mode in which it is possible to transmit or receive in three transmission or reception bands at the same time.

BACKGROUND

Portable communication devices, WLAN routers etc. or more generally: transmission/reception devices which communicate using RF signals, require RF filters in order to separate desired signals from undesired signals. Such filters can be connected, for example, in front-end circuits, for example in duplexers.

In this case, the filter should look after the task of distributing the signals between a chipset and filters which are possibly also present. The circuit complexity should be as low as possible. The filter should be compatible with a multiplicity of different filter technologies of further filters, should enable a small size of a corresponding component and, in particular, should allow high selectivity.

The trend for communication devices which can serve more and more frequency bands results in complex connections of different filters for the different frequency bands. Therefore, the need arises for tunable filters in order to be able to use different frequency bands with the same filter.

Previous solutions for these requirements are based substantially on expanding known filter circuits with tunable impedance elements or on the use of switches which can be used to connect filter elements to form a filter topology.

The article "Tunable Filters Using Wideband Elastic Resonators", Kadota et al., IEEE Transactions on Ultrasonics, Ferroelectrics and Frequency Control, Vol. 60, No. 10, October 2013, pages 2129-2136, discloses filter circuits in which tunable capacitors are added to RF filters having acoustic resonators.

The article "A Novel Tunable Filter Enabling Both Center Frequency and Bandwidth Tunability", Inoue et al., Proceedings Of The 42nd European Microwave Conference, Oct. 29-Nov. 1, 2012, Amsterdam, The Netherlands, pages 269-272, discloses RF filters having tunable capacitors and tunable inductances.

The article "RFMEMS-Based Tunable Filters", Brank et al., 2001, John Wiley & Sons, Inc. Int J RF and Microwave CAE11: pages 276-284, 2001, also discloses connections of L and C elements, the capacitances of the capacitive elements being adjustable.

The article "Tunable Isolator Using Variable Capacitor for Multi-band System", Wada et al., 978-1-4673-2141-9/13/$31.00, 2013 IEEE MTT-S Symposium and the published document WO2012/020613 disclose the use of isolators in RF filters.

In the LTE-A (Long-Term Evolution-Advanced) mobile radio standard, mobile telephones can be operated in the so-called carrier aggregation mode (CA) in order to enable high data rates during downlink and/or uplink operation. In the CA mode, transmission and reception operation is possible in a first frequency band, while reception can be carried out at the same time in a further frequency band. By convention, different band combinations were proposed for this purpose, preferably inter-band combinations in which the frequency bands differ considerably in the CA mode. The greater the frequency difference between the frequency bands to be combined in the CA mode, the easier the technical implementation.

Band combinations in which the frequency bands to be combined are in the same frequency range or in closely adjacent frequency bands have additionally been proposed. Promising technical implementations which can be implemented using a single antenna have not yet been proposed for such in-band CA modes.

SUMMARY OF THE INVENTION

Embodiments of the invention provide a front-end circuit having a tunable filter, which circuit easily covers a plurality of frequency bands and can be implemented using simple components. Further embodiments provide a front-end circuit which enables a carrier aggregation mode.

Embodiments provide front-end circuits which use exclusively tunable filters quickly result in a high degree of complexity of the circuit. In the case of tunable filters, all components of the circuit must meet the system requirements and, in particular, the specifications of the mobile radio standard over the entire frequency range within which the filter is tunable. This requires broadband and high-quality components.

Embodiments of the invention differs from the principle of using exclusively tunable filters. It is proposed to combine at least one first filter, which is tunable within a first frequency range, with a first fixed filter, which has a passband in an extra frequency band and is not tunable. The extra frequency band is arranged outside or inside the first frequency range, that is to say outside or inside the tuning range of the first filter. The two filters are arranged in a first signal path and in an extra signal path which are connected to an antenna connection of the front-end circuit.

This circuit makes it possible to cover common frequency bands of mobile radio standards using the first filter and its tunable frequency range. The extra frequency band can then be assigned to a mobile radio standard or the associated band which is outside conventional frequency ranges and therefore has an exclusive position. This has the advantage that the front-end circuit now covers the first frequency range and the extra frequency band without the need for a tunable filter which covers the first frequency range and the extra frequency band. The non-tunable first fixed filter can therefore be optimized for the extra frequency band, just like all other components which are arranged in this further signal path or are used to process the signals in this signal path. In particular, narrowband amplifiers and narrowband impedance matching circuits which are optimized for a narrow frequency band can therefore be integrated in the extra signal path.

Various embodiments provide the first signal path having the first tunable filter comprises a frequency range comprising a multiplicity of common bands, as have been proposed according to the latest release from the 3 GPP consortium, for example. The first frequency range may be a low-band range, for example, and may comprise frequencies of between 700 and 1000 MHz. However, it is also possible to design the first frequency range as a high band, with the result that the frequencies of 1700 to 2200 MHz are included.

Tunable filters for such relatively narrow tunable frequency ranges can be implemented using components as are already nowadays available with a sufficient quality.

Frequency bands which have already been defined and have a unique position with respect to the position of the frequency band are, for example, band 31 which is below 500 MHz and is therefore approximately 200 MHz away from the closest defined band. Covering this band, in addition to the low-band range, with the aid of a tunable filter would result in a high degree of complexity of the front-end circuit having the tunable filter. It is therefore advantageous to assign the first fixed filter to band 31 according to one embodiment.

The first frequency range and the extra frequency band can be connected to the same antenna connection if it is simultaneously ensured that signals from the respective other frequency range or from the extra frequency band do not cause any interference in the respective other band. This can be effected, for example, with the aid of a phase shifter circuit which rotates the frequencies in the respective other frequency band or frequency range in the direction of idling.

However, it is also possible to supply the two signal paths to separate antenna connections which are in the form of outputs of a diplexer, for example. The input of the diplexer can then be coupled to a common antenna.

However, it is also possible to supply the two signal paths to separate antennas. This makes it possible to transmit and receive signals simultaneously in the two signal paths without there being any interaction and mutual interference between the signals in the two signal paths.

It is useful to supplement the front-end circuit with a second signal path in which a second filter tunable within a second frequency range is arranged. This signal path can also be again connected to a common antenna connection to which the first and second signal paths and an extra signal path are connected. Multiplex operation can be carried out via a multiplexer, for example with the aid of phase shifter circuits.

However, it is also possible to provide two antennas, in which case one of the signal paths can be directly coupled to the antenna, while the other remaining signal paths are separated with the aid of a diplexer. Alternatively, the two signal paths connected to the common antenna can be separated via a multiplexer.

The second frequency range within which the second filter is tunable differs from the first frequency range and from the extra frequency band. It is also advantageous if these frequency ranges also do not have any frequency overlaps. A greater frequency spectrum can be covered with the front-end circuit with the first and second frequency ranges. The first and second frequency ranges can be selected, for example, in such a manner that they each cover frequencies in the low band or in the high band.

A multiplexer and/or a second antenna make(s) it possible to simultaneously transmit and receive in all three signal paths. In this manner, the front-end circuit is suitable for a carrier aggregation mode provided that the frequency bands combined in the carrier aggregation mode (CA mode) are inside the first and second frequency ranges and the extra band of the front-end circuit.

A carrier aggregation mode inside only one frequency range becomes possible if a fixed filter circuit which can be coupled to the same antenna connection is also provided. The fixed filter circuit then has an acoustic filter. A phase shifter circuit or a matching network between the fixed filter and the antenna connection allows operation in two signal paths without mutual interference, the frequency of one of which signal paths is tunable.

In various embodiments, a filter can also be understood as meaning a duplexer, with the result that the tunable filter may also be a tunable duplexer. The non-tunable first fixed filter may likewise be a duplexer.

In addition to the duplexer, a signal path then also comprises two path elements, namely a transmission path element and a reception path element which are connected to the same antenna connection via the duplexer. Further components, for example amplifiers or impedance matching circuits, may be arranged in each signal path or each signal path element. An impedance matching circuit may be arranged between an amplifier and the tunable filter in the tunable signal paths or in the signal paths having the tunable filter. This is advantageous, in particular, in the transmission path element since detuning may take place as a result of the tuning inside the frequency range, which detuning may result in increased losses. In the case of signal paths having tunable filters, it is likewise advantageous if a tunable antenna tuner is arranged between the antenna and the filter. On account of the relatively small frequency range within which the two filters in the two signal paths are tunable, the antenna tuner can also be referred to as narrowband.

Tunable amplifiers may be arranged in the first and second signal paths or generally in all signal paths in which tunable filters are arranged. In comparison with accordingly broadband amplifiers, tunable amplifiers have the advantage that they operate in a considerably more linear manner and therefore produce fewer intermodulation products than an accordingly broadband amplifier. Such amplifiers also have a higher efficiency.

In addition, a matching network may be arranged in each of the signal paths in the form of a transmission path or transmission path element. The matching network is preferably also tunable in the signal paths containing tunable filters. A permanently set matching network suffices in the extra signal path.

As already described, the antenna can be coupled to two signal paths via a diplexer. In this case, it is advantageous if those signal paths whose frequency ranges or frequency bands are inside two different decades are coupled via the diplexer. This means that the corresponding frequencies differ approximately by a factor of two, or the frequency ranges or the frequency band of the two signal paths comprise(s) such frequencies. In this case, it is possible to use an antenna with double resonance which can oscillate both at a fundamental frequency and at an associated harmonic and can therefore transmit and receive at these two frequencies. Such a behavior is achieved, for example, if a signal path having a frequency range in the low band is coupled, via a diplexer, to a signal path whose filter has a frequency range in the high band. In this case, signal paths having both tunable filters and filters set to fixed frequencies (fixed filters) can be coupled to one another.

Another configuration of the invention provides a second antenna to which a third and a fourth signal path are coupled via a further diplexer. The third and fourth signal paths have a third and a fourth filter, respectively, which are tunable in a third and a fourth frequency range, respectively. In this case too, use is advantageously made of a double resonant antenna, the main resonance and first harmonic of which are in the third and fourth frequency ranges of the third and fourth filters, respectively. Like already in the case of the first and second signal paths, an antenna tuner is also respectively arranged here between an output of the second diplexer and the respective filter. The third and fourth frequency ranges are selected in such a manner that the first to fourth frequency ranges differ from one another. Alternatively, the four frequency ranges, but preferably only two frequency ranges, can also overlap one another.

Such an arrangement makes it possible to cover a total of four frequency ranges using the four tunable filters. In this case, it is easily possible to simultaneously transmit or receive at a first frequency in the range of the first or second frequency range and at a second frequency in the range of the third or fourth frequency range and therefore to enable a carrier aggregation mode.

The tunable filters are, in particular, in the form of a filter circuit implemented from capacitances and inductances. Each filter circuit has at least one tunable reactance element, in particular an LC resonant circuit. The tunable reactance elements are implemented from high-quality L and C elements in order to respectively comply with the desired specifications for the tunable filter.

A high-quality passive component is understood as meaning a component having a Q factor of 100, for example. Tunable reactance elements having a tuning factor of up to four—based on the tunable capacitance or the tunable inductance—can be implemented from such high-quality L and C elements. Converted to the frequency, this means a tuning factor of up to two.

In one simple embodiment, such a filter circuit can be configured with four parallel resonant circuits which are coupled to four nodes inside a serial signal line. Each parallel resonant circuit is connected to ground and has a high-quality tunable reactance element. The parallel resonant circuits or individual elements of the parallel resonant circuits are coupled to one another, for example via coupling capacitors or coupling inductances which are arranged between each two circuit nodes of the serial signal line. However, the coupling may also be effected in a parasitic manner by arranging the reactance elements to be coupled to one another in the spatial vicinity of one another.

The tunable filter circuit also comprises a bridging inductance or a bridging capacitance which bridges the two circuit nodes terminally arranged on both sides in the serial signal line. The bridging inductance or capacitance is therefore connected in a parallel branch to the serial signal line.

The tunable reactance elements are preferably in the form of parallel resonant circuits, each comprising a parallel circuit of a high-quality tunable capacitor and a high-quality inductance.

Whereas high-quality inductances are preferably in the form of discrete components which can be configured to be tunable only in a complicated manner, a tunable capacitor can be implemented in different ways.

Tunable capacitors may be in the form of varactors or a switchable capacitor array in a semiconductor circuit. In this case, each capacitor in the capacitor array is in the form of an MIM (metal insulator metal) or MEMS (micro-electromechanical system) capacitor. Whereas varactors are semiconductor components which can be set to a particular capacitance value with the aid of an analog, a tunable capacitance in the form of a capacitor array can be tuned by connecting and disconnecting individual capacitors in the array. A switchable capacitor array therefore comprises a multiplicity of capacitors which can be connected in a parallel manner independently of one another with the aid of switches, preferably with the aid of semiconductor switches. The total capacitance results in this case from the sum of the capacitances of the individual capacitors connected in parallel in the capacitor array. In one embodiment of the invention, a tunable phase shifter is arranged between a tunable filter and the respective antenna connection to which the respective signal path is coupled.

All of the switchable or tunable elements, starting from the tunable amplifier, the tunable matching network, the tunable filter and the tunable antenna tuner and the tunable phase shifter, can be controlled by a common control unit. The control unit is, for example, an MIPI-RFFE (=mobile industry processor interface-radio frequency front-end) controller which can generate a corresponding digital or analog signal for controlling the tunable components. An MIPI-RFFE controller is designed to drive, control or tune all components which can be used in a terminal for wireless communication.

It is also possible to convert an MIPI signal (=signal generated by the MIPI-RFFE controller) into other needs-based signals. For example, a digital MIPI signal can be converted into an analog control signal if a tunable element needs such an analog signal for tuning.

BRIEF DESCRIPTION OF THE DRAWINGS

The invention is explained in more detail below using exemplary embodiments and the associated figures. The figures are used only to illustrate the invention and are therefore only schematic. Identical or identically acting parts are provided with identical reference symbols. For the sake of clarity, all elements to which reference is made need not be illustrated in the figures.

DETAILED DESCRIPTION OF ILLUSTRATIVE EMBODIMENTS

Figure 1:
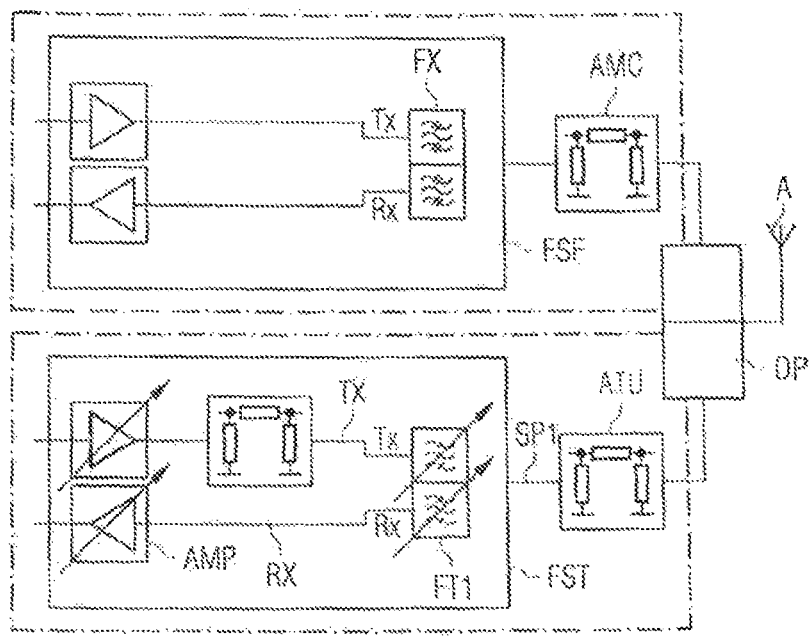
FIG. 1 shows a simple embodiment of the invention comprising a combination of a tunable filter circuit and a non-tunable filter circuit.

FIG. 1 shows a schematic symbol representation of a first exemplary embodiment of the front-end circuit according to the invention. The front-end circuit comprises a first tunable filter circuit FST and a filter circuit FSF which is fixed with respect to the frequency (fixed filter), is not tunable and is accordingly transmissive only for a particular frequency band.

A first signal path SP1 is coupled to an antenna in the first tunable filter circuit FST. The signal path therefore connects the antenna to a semiconductor component (not illustrated in the figure), for example a transceiver in which signals to be transmitted are generated and received signals are processed. A tunable filter FT1 which is in the form of a duplexer here is arranged in the first signal path. The duplexer splits the signal between two path elements, namely a transmission path element TX and a reception path element RX.

A tunable amplifier AMP and a matching network MC which is preferably likewise tunable are arranged between the semiconductor component and the tunable filter in the transmission path element TX.

A tunable amplifier AMP is likewise arranged in the reception path element RX. Optionally, each path may be formed from Rx and Tx, as described later in FIG. 8. The tunable filter may have tunable impedance and phase matching or may be connected to circuits which enable this.

The amplifier in the transmission path element TX is in the form of a power amplifier, whereas the tunable amplifier in the reception path element RX is in the form of an LNA (low noise amplifier).

The antenna tuner ATU which matches the impedance between the first tunable filter FT1 and the antenna A is arranged between the tunable first filter FT1 and the antenna A.

The fixed filter circuit FSF comprises an extra signal path SPX which is coupled to the antenna A and likewise connects the latter to a semiconductor component having a transceiver circuit, for example. Arranged on the antenna side is a fixed filter FX which is set to a pass frequency, is in the form of a duplexer in the figure and splits the extra signal path SPX into a transmission path element TX and a reception path element RX. A power amplifier is arranged in the transmission path element TX and an LNA is arranged in the transmission path element. An antenna matching circuit AMC for impedance matching may also be provided between the filter FX and the antenna A. Matching means between the amplifier AMP (PA or LNA) and the fixed filter FX may be optionally provided in the extra signal path or the fixed filter circuit FSF. Tunability of these elements is generally not necessary.

The front-end circuit illustrated can be used to cover a first frequency range which corresponds to the tuning range of the first filter FT1. A frequency band which is far away from other frequency ranges and the immediate vicinity of which does not contain any further frequency bands according to the modern definition can also be selected for the extra signal path SPX. A possible candidate for such an extra frequency band is the LTE band 31. Its frequency band is at approximately 500 MHz and therefore corresponds to the lowest frequency of all bands defined and discussed for telecommunications. Since it is difficult to form a tunable filter in such a manner that it comprises the low-band range of 700 to 1000 MHz and additionally band 31, some technical effort is needed. The solution according to embodiments of the invention of designing in the extra signal path SPX and the filter band 31 situated therein makes it easier to integrate band 31 in the front-end circuit and enables a simpler and less complex structure for the tunable filter FT.

The non-tunable fixed filter FX may be an acoustic filter, for example an SAW filter or a BAW filter. However, it is also possible to implement the non-tunable filter as a connection of passive components.

Figure 2:
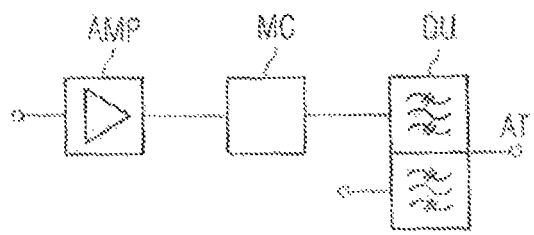
FIG. 2 shows components of a non-tunable filter circuit.

FIG. 2 separately shows the components of the fixed filter circuit FSF again. The extra signal path SPX connects an antenna connection AT to a transceiver circuit. A power amplifier AMP and a matching circuit MC are also provided in the extra signal path SPX. The matching circuit may be tunable, but may also be a hard-wired, non-tunable matching circuit. This structure may, in principle, likewise be provided in the reception path Rx.

The first signal path SP1 and the extra signal path SPX are each connected to an antenna connection AT which is coupled to the antenna A. The two signal paths are combined in a multiplexer which may be in the form of a diplexer DP, for example. However, it is also possible to provide phase shifter circuits in one or both signal paths, with the aid of which the frequencies of the respective other signal path can be blocked.

Figure 3:
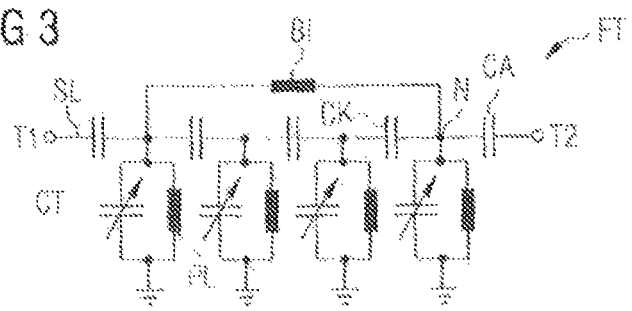
FIG. 3 shows the equivalent circuit diagram of a circuit which implements a tunable filter.

FIG. 3 shows a possible embodiment for a tunable filter FT implemented from L and C elements. This filter comprises a serial signal line SL which connects a first connection T1 to a second connection T2. The signal line has four circuit nodes N, to each of which a parallel branch to ground is connected. Each parallel branch here comprises a parallel circuit of a tunable capacitance CT and a parallel inductance PL. The parallel branches are coupled to one another capacitively or inductively, for example via coupling capacitors CK each arranged between two circuit nodes N, as illustrated in the figure. Two further connection capacitances CA are arranged between the outermost circuit nodes in the signal line and the connections T1 and T2. The connection impedance of the filter circuit FT can be set via the connection capacitances.

The two terminal signal nodes are bridged in a parallel manner using a bridging inductance BI or a bridging capacitance (not illustrated) which therefore forms a parallel path to the signal line SL.

The passband of the filter can be shifted inside the tuning range by accordingly tuning the tunable capacitances CT. If high-quality passive components are used for the parallel circuits, maximum tuning by a factor of 2 can be achieved. In practice, however, it is sufficient to restrict the tunability to a smaller frequency range.

Figure 4:
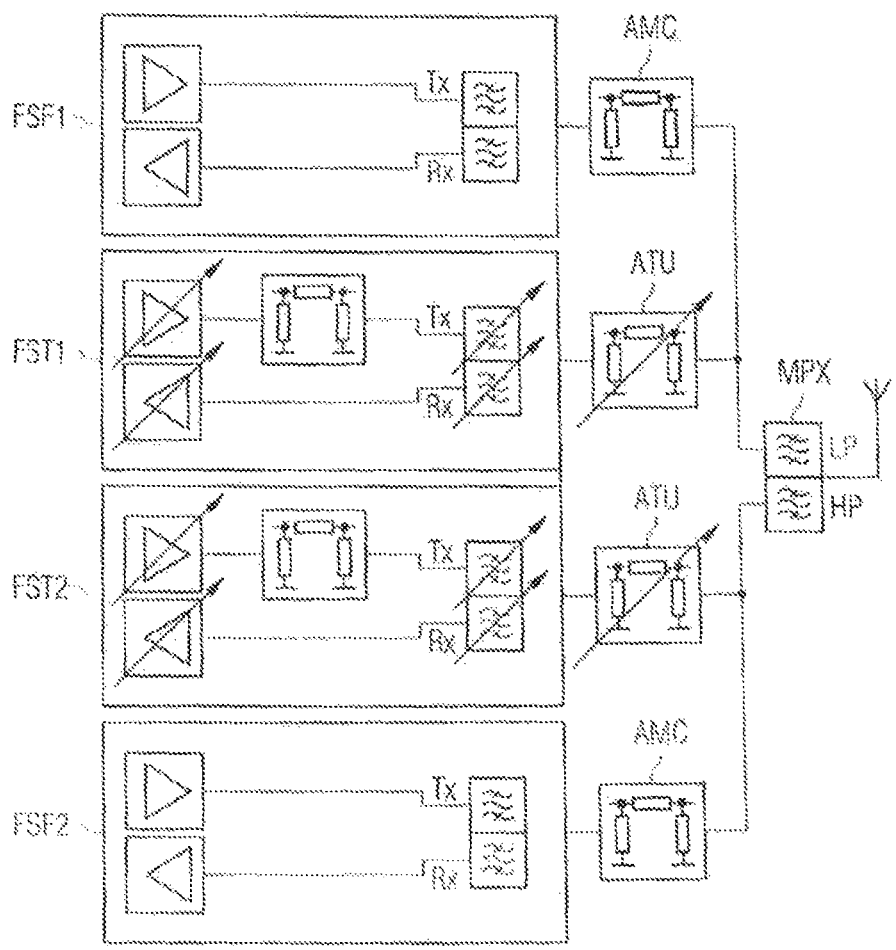
FIG. 4 shows an embodiment having two tunable filter circuits and two fixed filter circuits on one antenna.

FIG. 4 shows a general possibility of how the arrangement shown in FIG. 1 can be extended by two further signal paths and the frequency ranges and frequency bands allocated to said signal paths.

The front-end circuit shown comprises two fixed filter circuits FSF1 and FSF2 and two tunable filter circuits FST1, FST2, in each of which a signal path is implemented. All four signal paths can be combined via a multiplexer MPX which may be in the form of a diplexer, for example. The first frequency range of the first tunable filter circuit FST1 and the second frequency range of the second tunable filter circuit FST2 are different with regard to the frequency and also differ from the bands for which the non-tunable filter circuits FSF1 and FSF2 are set up. The non-tunable filters may each again be tuned to a band which is outside common frequency ranges, preferably a band having a particularly low frequency, a particularly high frequency or a center frequency arranged between two frequency ranges which are remote from one another. Band 31 which is at approximately 500 MHz, band 21 which is at a center frequency of approximately 1450 MHz and band 22 which is at particularly high frequencies are again appropriate for this purpose. The first and second frequency ranges can be assigned to the already known low-band range and high-band range. However, it is also possible to assign the two tunable frequency ranges to frequencies other than those mentioned, as well as the extra frequency bands of the two non-tunable filter circuits FSF.

Antenna matching AMC, which comprises unchangeable connection of passive components, is respectively provided between the two extra signal paths SPX containing the non-tunable filters and the multiplexer MPX.

Antenna tuner circuits ATU which match the impedance between the tunable filter and the multiplexer according to the tuned frequency are provided between the two tunable filter circuits FST1 and FST2 and the multiplexer MPX.

Two filter circuits, respectively selected from a tunable filter circuit FST and a non-tunable filter circuit FSF, are assigned to an output of the multiplexer MPX. Pairs are formed such that frequency separation can be achieved via a high-pass filter and a low-pass filter in the multiplexer.

Figure 5:
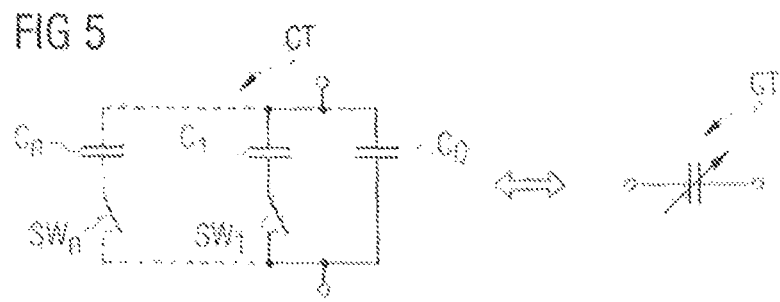
FIG. 5 shows a switchable capacitor array.

FIG. 5 schematically shows a switchable capacitor array in which capacitances C can be connected in parallel with the aid of switches SW. Each of the switches SW1 to SWN can connect a capacitance value C1 to CN of a basic capacitance Co, thus resulting in a parallel circuit of the connected capacitances, the capacitance value of which results from the sum of the individual capacitances. Such a switchable capacitor array makes it possible to vary the resulting total capacitance inside a wide tuning range. The tuning range of the filter circuit can be made to be accordingly large using such a capacitor array. The right-hand side of the figure illustrates the circuit symbol for a tunable capacitance CT which is implemented here precisely by the switchable capacitor array.

Tunable capacitances which are in the form of varactors are not illustrated. Such components are known as such and do not require any separate explanation or illustration.

Figure 6:
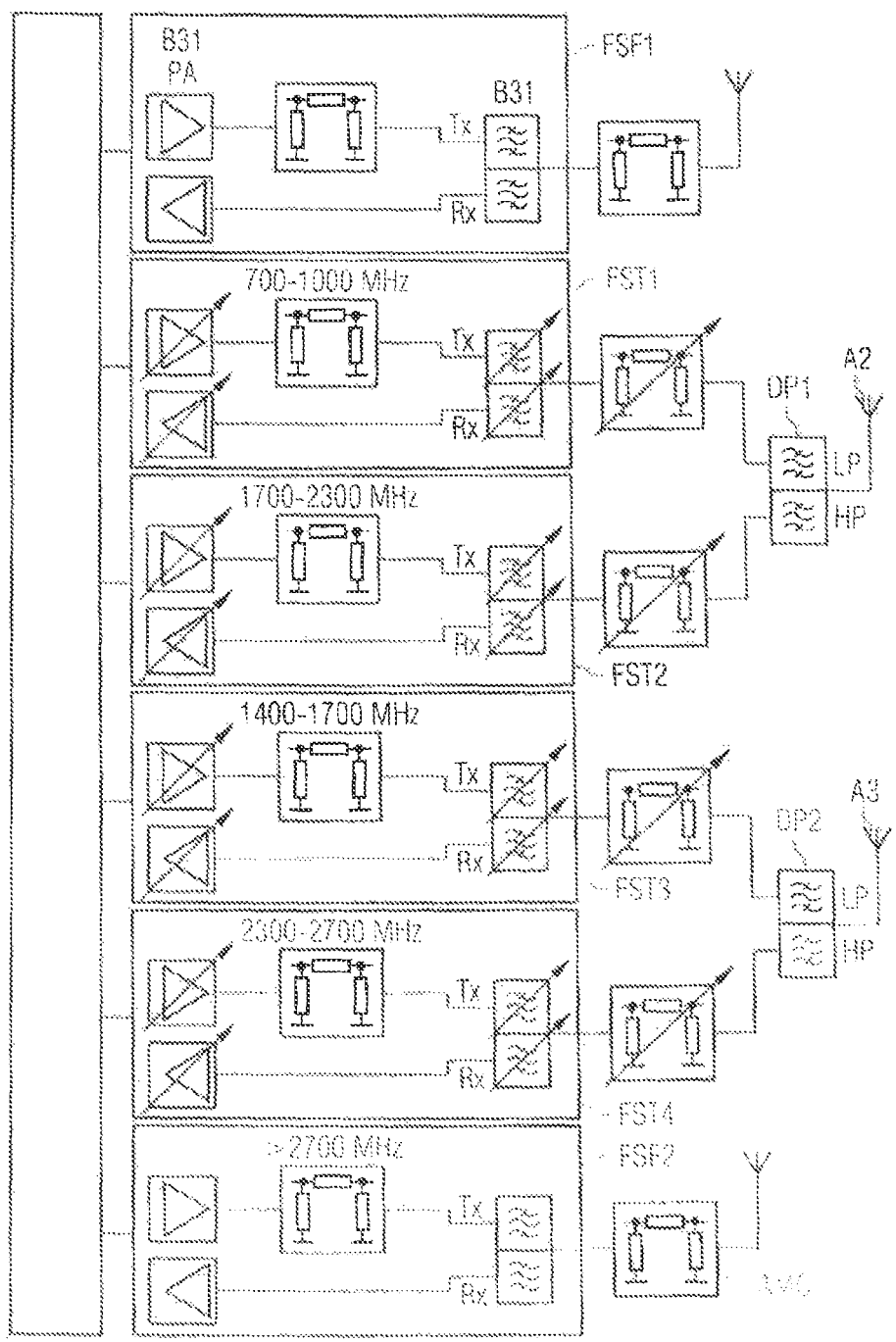
FIG. 6 shows a front-end circuit having six filter circuits which are coupled to four different antennas.

FIG. 6 shows a front-end circuit which has been expanded again. In this embodiment, two non-tunable filter circuits FSF1 and FSF2 are each connected to a separate antenna via an antenna matching circuit AMC in each case. A first and a second signal path each with a tunable filter for a first and a second frequency range are connected to a further antenna A2. On the antenna side, the two signal paths lead to a duplexer, in which case an antenna tuner ATU is respectively arranged between the tunable filters and the duplexer. Two signal paths having tunable filters (or tunable filter circuits FST1, FST2) arranged therein are connected in the same way to a second antenna A2 via a diplexer DP2. These third and fourth signal paths having a tunable filter differ from the connection of the first and second signal paths only by the frequency range to which the tunable filters are tunable. As a result, four signal paths having four different frequency ranges are covered by the circuit, each of the four tunable filters being tunable within one of the frequency ranges. The two non-tunable signal paths having the filters each assigned to a fixed frequency cover frequency bands which are outside the four frequency ranges. Each of these signal paths can be designed as already explained using FIG. 1 or 2.

On account of the four different antennas, the arrangement according to FIG. 6 enables simultaneous operation in two tunable frequency ranges and in two permanently assigned bands. With a suitable configuration of the corresponding duplexers, the two signal paths connected to a respective duplexer can likewise be operated simultaneously, with the result that the number of signal paths which can be operated simultaneously overall is increased to six.

The four tunable filter circuits FST1 to FST4 can be allocated to different frequency bands. It is possible, for example, to assign the first tunable filter circuit FST1 to the low-band range of 700 to 1000 MHz, to assign the second tunable filter circuit FST2 to the range of 1700 to 2300 MHz, to assign the third tunable filter circuit FST3 to the range of 1400 to 1700 MHz and to assign the fourth tunable filter circuit FST4 to the range of 2300 to 2700 MHz.

The frequency ranges which are assigned to a common antenna and are separated via a diplexer DP are selected in this case in such a manner that the frequency bands differ approximately by a factor of two, with the result that a double resonant antenna can be optimized for the respective combination of frequency ranges.

The two non-tunable filter circuits FSF1 and FSF2 which are allocated to fixed bands may be assigned to bands which are outside these ranges. For example, the first non-tunable filter circuit FSF1 may be allocated to band 31 at approximately 500 MHz and the second non-tunable filter circuit FSF2 may be allocated to a frequency band above 2700 MHz. These extreme bands can otherwise be concomitantly incorporated only with difficulty in the first or fourth tuning range, with the result that a separate implementation is worthwhile.

Alternatively, those bands which enable an intra-band CA mode can be selected for the two non-tunable fixed filter circuits FSF1 and FSF2. These bands are therefore defined and/or provided for CA mode in one of the tuning ranges of the tunable filters.

In this figure and in all other figures, a tunable filter can also be understood as meaning, in particular, a duplexer which is tunable both with respect to transmission filters and with respect to reception filters. However, in a manner differing from this, a signal path may also have only one filter and, as a pure radio band, is equipped with a reception filter RX, for example. In particular, these pure radio channels can be allocated to a non-tunable filter circuit FSF.

Figure 7:
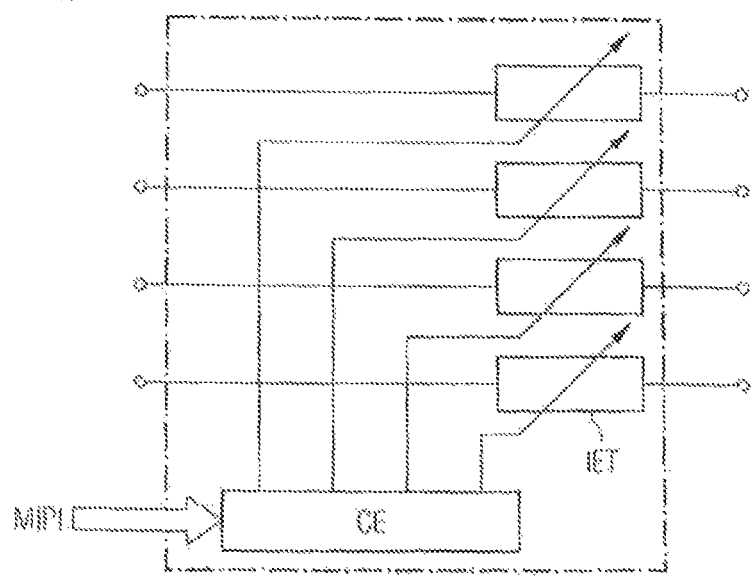
FIG. 7 shows the control of tunable components with the aid of a control element.

FIG. 7 shows the possible driving of a combination of tunable impedance elements IET which may comprise, for example, tunable capacitors and are used in a tunable filter circuit FST as illustrated in FIG. 3, for example. Each of the four tunable impedance elements IET illustrated here is connected to a common control element CE which provides analog or digital data for tuning the respective capacitor. The control element CE can be driven via an MIPI RFFE controller which provides digital instructions which are then implemented by the control element CE in a corresponding manner and in a suitable manner for the tunable capacitors CT.

All of the tunable impedance elements of a front-end circuit according to embodiments of the invention can be implemented in a single semiconductor circuit and can be driven by a common control element CE.

Figure 8:
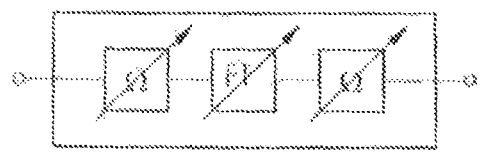
FIG. 8 shows a tunable filter circuit having an additionally tunable input and output impedance.

FIG. 8 shows a further possible configuration of a tunable filter circuit Fr, as can be arranged in each of the tunable signal paths. In addition to the frequency tuning, the circuit also has, on the input and output sides, impedance matching circuits MC which are integrated in a tunable filter circuit as illustrated in FIG. 3, for example. These matching means may be in the form of tunable impedance elements, for example tunable capacitors.

Figure 9:
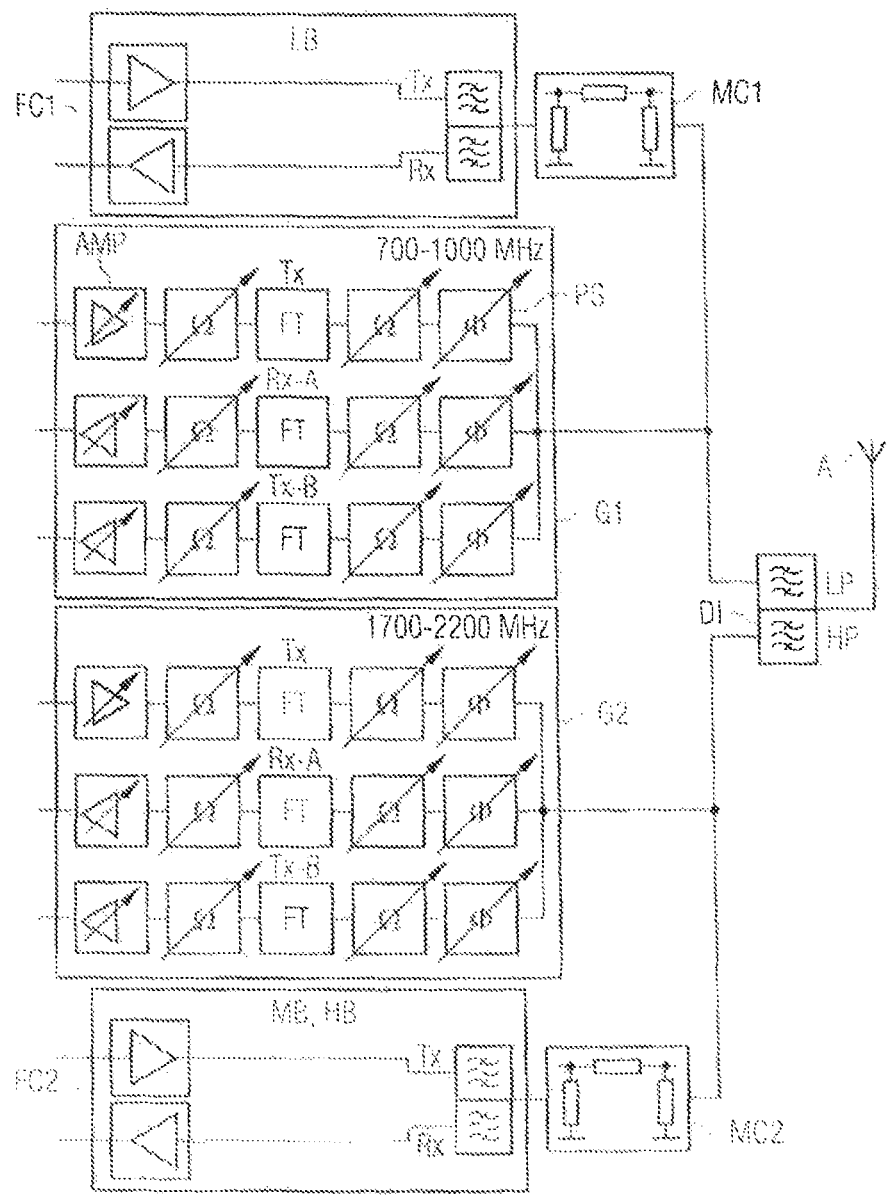
FIG. 9 shows a front-end circuit having two groups of tunable signal paths and additionally two signal paths each having a fixed filter circuit.

FIG. 9 shows a further configuration. A diplexer DI which provides virtually two antenna connections at its outputs is connected to an antenna A. A group G1, G2 of two or more signal paths is coupled to each of the two outputs or antenna connections. Each group of signal paths has a tunable filter FT in the signal path, the tuning ranges of all tunable filters in a group being assigned to the same frequency range, and the tunable filters in the other group being assigned to a frequency range which differs therefrom.

The two groups or the tuning ranges of the filters inside the two groups are assigned to two different frequency ranges selected from the range of less than 700 MHz, the range from 700 MHz to 1000 MHz, the range from 1000-1400 MHz, the range from 1400-1700 MHz, the range from 1700-2200 MHz, the range from 2200-2700 MHz and the range above 2700 MHz.

Inside each group of signal paths, at least one signal path, together with the tunable filter, is designed for transmission operation, that is to say as a Tx path, while at least one other signal path in the group G is designed as a reception path, that is to say as an Rx path. In FIG. 10, each group also has an optional third signal path which is preferably designed as an Rx path but likewise has a tunable filter.

Each tunable filter is designed as illustrated in FIG. 8, for example. Each signal path additionally also has, on the antenna side, a phase shifter circuit PS whose phase angle can be tuned. The phase shifter circuits make it possible to combine the two or three filters at a common antenna connection such that filter transfer functions having optimized low in-band losses and optimal suppression of signals outside the passband can be implemented.

The diplexer DI is able to separate the two frequency ranges and to allocate transmitted signals to the corresponding group of signal paths according to their frequency range. Since the signal paths also have circuits for matching the input and output impedance, an antenna tuner is superfluous.

A phase shifter circuit PS is arranged between the filter and the antenna connection in the respective signal path, whereas an amplifier AMP which is optionally tunable is arranged in each signal path at the end remote from the antenna. The filter can be optimally matched to the load impedance by means of the tunable filters which, according to FIG. 8, are additionally designed with a tunable input and output impedance. The circuit is suitable and usable both for TDD operation and for FDD operation.

As illustrated in FIG. 9, the arrangement may also be supplemented with one or two signal paths having fixed filter circuits FC1, FC2 each connected to one of the two outputs of the diplexer DI. Each fixed filter circuit has a filter fixedly set to a frequency band and a corresponding amplifier. The filter may also be a duplexer. The filter may be an acoustic filter. A matching network which matches the impedance and phase of the fixed filter circuit to the antenna and the load is connected between the fixed filter circuit FC and the diplexer.

The additional filter circuits FC may be assigned to the same frequency range as the group of signal paths connected to the same output of the diplexer. An intra-band carrier aggregation operating mode is therefore possible, in which two frequencies inside the same frequency band or frequency range can be simultaneously used for a mobile radio connection. This can be achieved only in a complicated manner using only tunable filters.

The bands of the two fixed filter circuits FSF1 and FSF2 can also overlap the tuning ranges of the tunable filters in the two groups.

A carrier aggregation operating mode with bands which are in different frequency ranges and can transmit at the same time is already possible with the two groups G1, G2 of signal paths which are indeed assigned to different frequency ranges and each provide a Tx and an Rx signal path.

According to another operating mode, the Tx signal path and the Rx signal path in the same group can be used for normal duplex operation, that is to say for simultaneous transmission and reception inside the same band. The phase shifter circuit and the tunable impedance matching enable the duplex function without mutual interference in the respective other signal path.

It is also possible to assign the additional signal paths having filter circuits FC to bands outside the frequency ranges allocated to the two groups. Such bands can be selected for a carrier aggregation operating mode, that is to say can be allocated to a band for which a CA mode with a band inside one of the two frequency ranges of the groups is provided.

The invention is not restricted to the arrangements and configurations illustrated in the figures and described in the exemplary embodiments. Rather, the invention is characterized by the features of claim 1 and also comprises individual novel features per se even if they are claimed in combination with other features in the subclaims.

The invention claimed is:

1. A front-end circuit comprising:
   a first signal path connected to a first antenna connection;
   a first filter arranged in the first signal path, wherein the first filter is tunable within a first frequency range;
   an extra signal path and a first fixed filter arranged therein, wherein the first fixed filter has a passband for an extra frequency band, wherein the first fixed filter is not tunable, and wherein the extra frequency band is arranged outside or inside the first frequency range;
   a first narrowband antenna tuner configured to be set to a first tunable frequency range, wherein the first narrowband antenna tuner is arranged between the first filter and the antenna connection in the first signal path; and
   a second narrowband antenna tuner configured to be set to a second tunable frequency range, wherein the second narrowband antenna tuner is arranged between the first fixed filter and the antenna connection in the extra signal path.

2. The front-end circuit of claim 1, further comprising:
   a tunable matching network arranged in the first signal path and extra signal path, wherein the tunable matching network is in the form of a transmission path or a transmission path element and comprises additional tunable filters.

3. The front-end circuit according to claim 2,
   wherein the first signal path is coupled to a first antenna via the first antenna connection, and
   wherein the extra signal path is coupled to a second antenna via an extra antenna connection.

4. The front-end circuit according to claim 3, wherein the first filter and the first fixed filter each comprises:
   a duplexer having a transmission filter element and a reception filter element, wherein both the transmission filter element and the reception filter element are tunable and are each arranged in a transmission path element or a reception path element.

5. The front-end circuit according to claim 2, further comprising:
   an amplifier arranged in each signal path.

6. The front-end circuit according to claim 3, further comprising:
   amplifiers, whose operating frequency are tunable, arranged in the signal paths in which the first filter and the additional tunable filters are arranged.

7. The front-end circuit according to claim 3,
   wherein the tunable filters each comprises a filter circuit,
   wherein each filter circuit comprises capacitances and inductances and, respectively, have a plurality of passive L and C elements, and
   wherein values of the respective passive L and C elements is tunable.

8. The front-end circuit according to claim 2, further comprising:
   a serial signal line having at least four circuit nodes;
   parallel branches each coupled to a circuit node and connected to ground; and
   a tunable reactance element arranged in each of the parallel branches, wherein each of the tunable reactance elements are coupled to one another.

9. The front-end circuit according to claim 8,
wherein the tunable reactance elements are coupled to one another via coupling capacitors, and
wherein the coupling capacitors are arranged in the serial signal line between two adjacent circuit nodes in each case.

10. The front-end circuit according to claim 9,
wherein end circuit nodes of the at least four circuit nodes are connected to one another via a bridging inductance connected in parallel with the serial signal line or a bridging capacitance, and
wherein the reactance elements are in the form of parallel resonant circuits each comprising a parallel circuit of a tunable capacitor and an inductance.

11. The front-end circuit according to claim 10, wherein the tunable capacitors are in the form of varactors or a switchable capacitor array embodied in a semiconductor circuit and comprising metal insulator metal (MIM) or micro-electromechanical system (MEMS) capacitors.

12. The front-end circuit according to claim 2, further comprising:
a tunable phase shifter arranged in each of the first signal path between the first filter and the first antenna connection and the extra signal path between the first fixed filter and an extra antenna connection.

13. The front-end circuit according to claim 12, wherein the tunable phase shifter and the first tunable filter are connected to a control unit and are tunable by a control signal from the control unit.

14. The front-end circuit according to claim 2, wherein the front-end circuit is configured to provide an intra-band carrier aggregation (CA) mode via the extra signal path having the first fixed filter and the first signal path having the tunable first filter.

15. The front-end circuit according to claim 1, further comprising:
a second signal path and a second filter arranged therein, wherein the second filter is tunable within a second frequency range which differs from the first frequency range and differs from the extra frequency band.

16. The front-end circuit according to claim 15, further comprising:
a diplexer arranged between the antenna connection and the first and second signal paths, wherein the first and second signal paths are connected to outputs of the diplexer, and wherein the antenna connection is connected to a first antenna that is an oscillateable double resonant antenna configured to transmit and receive signals at a fundamental oscillation and an associated first harmonic.

17. The front-end circuit according to claim 16, further comprising:
a second antenna;
a third and a fourth signal path and third and fourth filters arranged therein and being tunable within a third and a fourth frequency range;
a second diplexer arranged between the second antenna and the third and fourth signal paths; and
an antenna tuner arranged between each of the two outputs of the second diplexer and the third and fourth filters, wherein the first to fourth frequency ranges differ from one another or overlap.

18. A front-end circuit comprising:
a first signal path connected to an a first antenna connection;
a first filter arranged in the first signal path, wherein the first filter is tunable within a first frequency range;
an extra signal path and a first fixed filter arranged therein, wherein the first fixed filter has a passband for an extra frequency band, wherein the first fixed filter is not tunable, and wherein the extra frequency band is arranged outside or inside the first frequency range;
a tunable matching network arranged in the first signal path and the extra signal path, wherein the tunable matching network is in the form of a transmission path or a transmission path element and comprises additional tunable filters, wherein the first signal path is coupled to a first antenna via a the first antenna connection, and wherein the extra signal path is coupled to a second antenna via an extra antenna connection;
a diplexer arranged between the first antenna and the first and extra signal paths, wherein the first and extra signal paths are connected to outputs of the diplexer, and wherein the first antenna is an oscillateable double resonant antenna configured to transmit and receive signals at a fundamental oscillation and an associated first harmonic;
a second antenna;
a third and a fourth signal path and third and fourth filters arranged therein and being tunable within a third and a fourth frequency range;
a second diplexer arranged between the second antenna and the third and fourth signal paths; and
an antenna tuner arranged between each of the two outputs of the second diplexer and the third and fourth filters, wherein the first to fourth frequency ranges differ from one another or overlap.

* * * * *